(12) United States Patent
Sheu et al.

(10) Patent No.: US 8,482,304 B2
(45) Date of Patent: Jul. 9, 2013

(54) SENSING ELEMENT INTEGRATING SILICON NANOWIRE GATED-DIODES, MANUFACTURING METHOD AND DETECTING SYSTEM THEREOF

(75) Inventors: Jeng-Tzong Sheu, Hsinchu (TW); Chen-Chia Chen, Changhua (TW)

(73) Assignee: National Chiao Tung University, Hsinchu (TW)

( * ) Notice: Subject to any disclaimer, the term of this patent is extended or adjusted under 35 U.S.C. 154(b) by 419 days.

(21) Appl. No.: 12/655,109

(22) Filed: Dec. 23, 2009

(65) Prior Publication Data

US 2010/0321044 A1 Dec. 23, 2010

(30) Foreign Application Priority Data

Jun. 17, 2009 (TW) .................................. 098120307

(51) Int. Cl.
*G01R 27/08* (2006.01)
(52) U.S. Cl.
USPC .......................................... 324/693; 324/691
(58) Field of Classification Search
USPC ................................ 324/691, 693; 435/287.1
See application file for complete search history.

(56) References Cited

U.S. PATENT DOCUMENTS

| | | | |
|---|---|---|---|
| 7,597,788 B2 * | 10/2009 | Visel et al. | 204/400 |
| 7,910,064 B2 * | 3/2011 | Hamilton et al. | 422/82.01 |
| 2008/0081326 A1 * | 4/2008 | Amano | 435/5 |
| 2008/0286767 A1 * | 11/2008 | Miyahara et al. | 435/6 |
| 2011/0024719 A1 * | 2/2011 | Sridhar et al. | 257/9 |

* cited by examiner

*Primary Examiner* — Amy He
(74) *Attorney, Agent, or Firm* — Hudak, Shunk & Farine Co. LPA

(57) ABSTRACT

The invention disclosed a sensing element integrating silicon nanowire gated-diodes with microfluidic channel, a manufacturing method and a detecting system thereof. The sensing element integrating silicon nanowire gated-diodes with a microfluidic channel includes a silicon nanowire gated-diode, a plurality of reference electrodes, a passivation layer and a microfluidic channel. The reference electrodes are formed on the silicon nanowire gated-diodes, and the passivation layer having a surface decorated with chemical materials is used for covering the silicon nanowire gated-diodes, and the microfluidic channel is connected with the passivation layer. When a detecting sample is connected or absorbed on the surface of the passivation layer, the sensing element integrating silicon nanowire gated-diodes with the microfluidic channel can detect an electrical signal change.

26 Claims, 13 Drawing Sheets

A-A

SENSING ELEMENT INTEGRATING SILICON NANOWIRE GATED-DIODES, MANUFACTURING METHOD AND DETECTING SYSTEM THEREOF

BACKGROUND OF THE INVENTION

1. Field of the Invention

The present invention relates to a sensing element integrated with silicon nanowire gated-diodes, a manufacturing method, and a detecting system, in particular to a sensing element, a manufacturing method and a detecting system capable of generating an electric signal change by a silicon nanowire gated-diode when a detecting sample is in contact with a decorated surface.

2. Description of the Related Art

Field effect transistor (FET) is a semiconductor device provided for controlling the magnitude of a current by an electric field effect. Since the field effect transistor has the advantages of a small volume, a light weight, a power-saving feature, a long life, a high input impedance, a low noise, a good thermal stability, a strong radiation resistance and a simple manufacturing procedure, the scope of applicability of the field effect transistor is very broad, particularly in the fields of large scale integrated circuit (LSI) and very large scale integrated circuit (VLSI).

Since a nano-dimension field effect transistor has a very high electric sensitivity, therefore it can be used as a basic structure of a bio-sensor and applied in a bio-sensing area. However, a field effect transistor channel made of carbon nanotubes has difficulties of positioning carbon nanotubes, separating carbon nanotubes with both metal and semiconductor properties, decorating a surface of the carbon nanotube, and manufacturing large-area FET channels. The silicon nanowire field effect transistor adopting a top-down process technology incurs expensive manufacturing process and cost. If a bottom-up process technology is adopted, then there will be difficulties of positioning silicon nanowires, controlling a uniform radius of the silicon nanowires, and maintaining a good yield rate for a large-area manufacturing process.

In view of these shortcomings of the prior art, the inventor of the present invention based on years of experience to conduct researches and experiments, and finally developed a sensing element integrating silicon nanowire gated-diodes, a manufacturing method and a detecting system in accordance with the present invention to be applied for sensing and detecting nanoparticles, chemical molecules or biological species. Since the sensing element of the present invention relates to a Schottky contact, therefore the sensitivity is much higher than the sensitivity of a general traditional transistor, and the detection range can be adjusted according to the buffering capacity of a buffer solution, and the detection range of the invention is also larger than those of general current-mode and potential-mode methods.

SUMMARY OF THE INVENTION

It is a primary objective of the present invention to overcome the shortcomings of the prior art by providing a sensing element integrating silicon nanowire gated-diodes applied in an area of sensing and detecting nanoparticles, chemical molecules or biological species and providing a higher detection sensitivity and a larger detection range.

To achieve the foregoing objective, the present invention provides a sensing element integrating silicon nanowire gated-diodes, comprising a silicon nanowire gated-diode, a passivation layer and a microfluidic channel. The passivation layer is covered onto a silicon nanowire Schottky diode including a decorated surface and the microfluidic channel is coupled to the passivation layer. If a detecting sample is in contact with the decorated surface of the passivation layer through the microfluidic channel, the silicon nanowire gated-diode will generate an electric signal correspondingly.

The silicon nanowire gated-diode is preferably a PN junction diode or a silicon nanowire Schottky diode, and the detecting sample is preferably an electrically charged matter such as a nanoparticle, a chemical molecule, or a ribonucleic acid (RNA), a deoxyribonucleic acid (DNA), vitamin H (biotin), or a biological matter such as an enzyme, a protein, a virus or a lipid, etc.

Another objective of the present invention is to provide a manufacturing method of a sensing element integrating silicon nanowire gated-diodes, and the method comprises the steps of:

a) providing a silicon nanowire gated-diode;
b) defining an anode, a cathode and a reference electrode by a photolithography;
c) depositing a passivation layer onto the silicon nanowire gated-diode;
d) heating and coupling a microfluidic channel with a passivation layer; and
e) decorating a surface of the passivation layer to complete manufacturing the sensing element.

The decorated surface is decorated by a chemical method or a physical method.

The chemical method for the decoration preferably includes a silane coupling agent containing an amino group, a carboxyl group, an aldehyde group or a thiol group, or a metal complex containing nickel, iron, gold, silver, or platinum.

A further objective of the present invention is to provide a detecting system for detecting a detecting sample, and the detecting system comprises the aforementioned sensing element and a signal output element. The sensing element is provided for detecting an electric signal, and the signal output element is provided for outputting and recording the electric signal. A change of the electric signal is observed for performing a trace detection of the detecting sample.

The electric signal preferably has a current value, a resistance value or a conductance value.

The signal output element is preferably a semiconductor parameter analyzer.

In summation of the description above, the sensing element integrating silicon nanowire gated-diodes, manufacturing method and detecting system of the present invention have one or more of the following advantages:

(1) The sensing element with a decorated device surface can capture nanoparticles, chemical molecules or biological species, and thus it can be used extensively in areas of detecting nanoparticles, chemical molecules or biological species.

(2) The sensing element uses a silicon nanowire gated-diode structure as a basis to improve the sensitivity of a conventional field effect transistor and simplify the manufacturing process.

DETAILED DESCRIPTION OF THE PREFERRED EMBODIMENTS

Figure 1A:
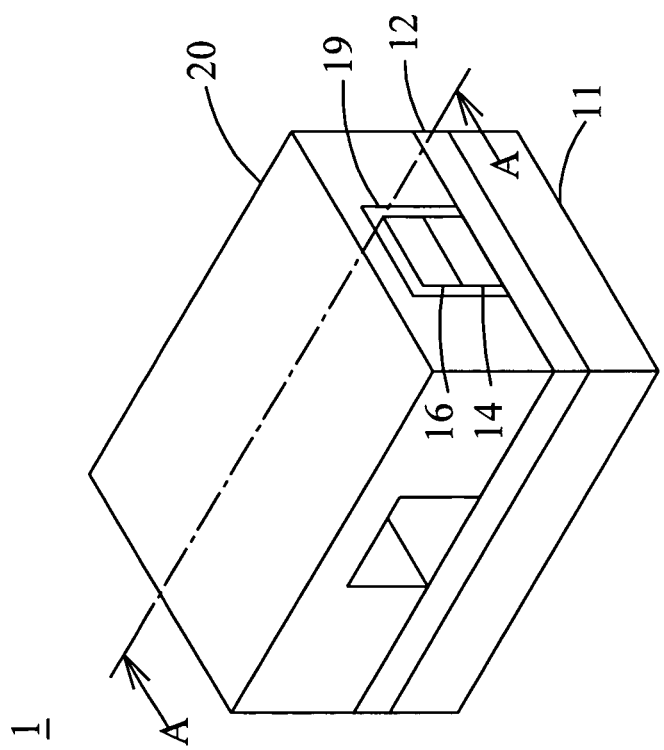
FIG. 1A is a side view of a sensing element integrating silicon nanowire gated-diodes in accordance with the present invention.
Figure 1B:
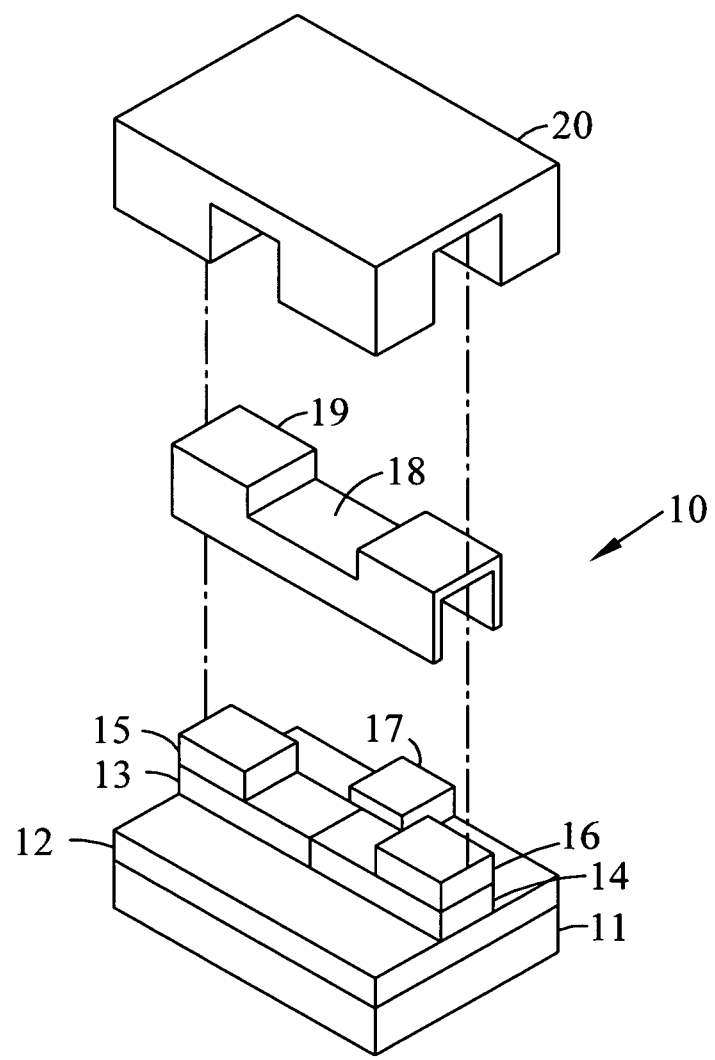
FIG. 1B is an exploded view of a sensing element integrating silicon nanowire gated-diodes in accordance with the present invention.
Figure 1C:
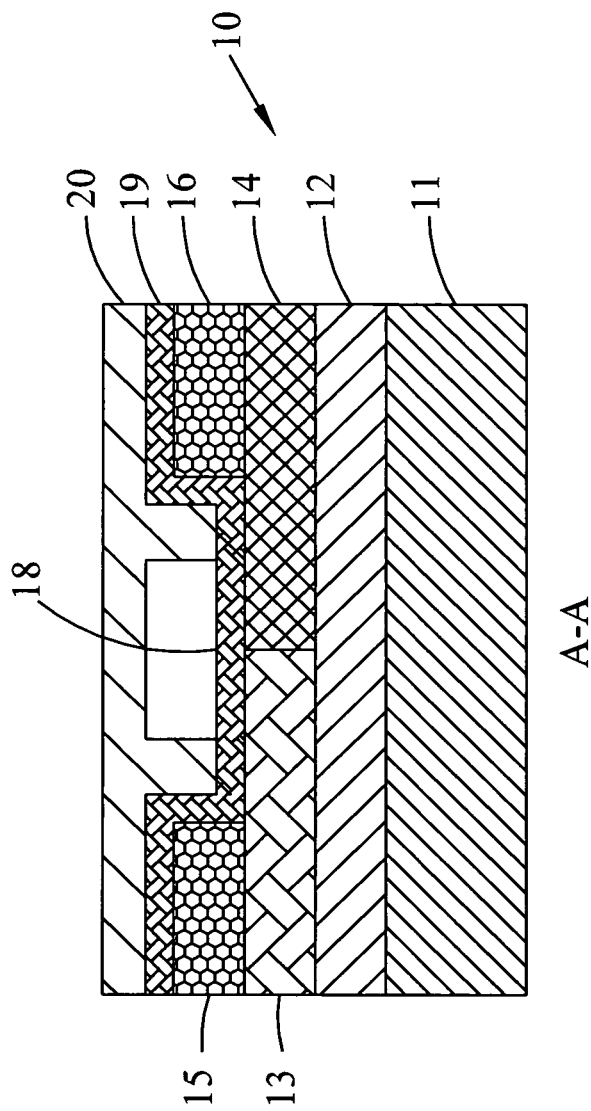
FIG. 1C is a cross-sectional view of Section A-A as depicted in FIG. 1A.

With reference to FIG. 1, FIG. 1A shows a side view of a sensing element integrating silicon nanowire gated-diodes of the present invention, FIG. 1B shows an exploded view of a sensing element integrating silicon nanowire gated-diodes of the present invention, and FIG. 1C shows a cross-sectional view of Section A-A of FIG. 1A. In FIG. 1, the sensing element integrating silicon nanowire gated-diodes comprises a silicon nanowire diode, a reference electrode 17, a passivation layer 19 and a microfluidic channel 20.

The silicon nanowire gated-diode is preferably a PN junction diode or a silicon nanowire Schottky diode 10. In the figure, a silicon nanowire Schottky diode 10 is used for illustrating the silicon nanowire gated-diode. The silicon nanowire Schottky diode 10 comprises a substrate 11, an insulating layer 12, and a silicon nanowire. The insulating layer 12 is disposed on the substrate 11, and a first portion 13 and a second portion 14 of the silicon nanowire are disposed on the insulating layer 12, and the substrate 11 is preferably made of monocrystalline silicon or glass, and the insulating layer 12 is preferably made of a silicon compound such as silicon dioxide or silicon nitride, and the first portion 13 of the silicon nanowire is preferably made of monocrystalline silicon, polycrystalline silicon or amorphous silicon, and the second portion 14 is preferably made of a metal silicide such as nickel silicide, platinum silicide, titanium silicide and cobalt silicide.

The first contact electrode 15 is disposed on the first portion 13 of the silicon nanowire, and the second contact electrode 16 is disposed on the second portion 14 of the silicon nanowire, and the passivation layer 19 is covered onto the first portion 13 and second portion 14 of the silicon nanowire.

The silicon nanowire Schottky diode 10 has a decorated surface 18 for combining or adsorbing a detecting sample, and the microfluidic channel 20 is coupled to the passivation layer 19 to form a channel for passing the detecting sample.

The reference electrode 17 is disposed on the insulating layer 12 and adjacent to the first portion 13 and second portion 14 of the silicon nanowire. The reference electrode 17 is preferably made of gold, platinum, or silver/chlorine, and the passivation layer 19 is preferably made of an insulating material such as silicon dioxide, silicon nitride or aluminum oxide, and the microfluidic channel 20 is preferably made of silicon or a silicon compound such as silicon dioxide or an organic material such as polydimethylsiloxane (PDMS), polymer material SU-8, polymethylmethacrylate (PMMA) or cyclic olefin copolymer (COC), etc.

If the detecting sample is passed through a decorated surface 18 of a channel formed by coupling the microfluidic channel 20 and the passivation layer 19, the silicon nanowire gated-diode 10 will generate an electric signal correspondingly. The existence of the detecting sample can be detected by a confirmation of a change of the electric signal.

The decorated surface 18 is decorated by a chemical method or a physical method, and the chemical method preferably uses a silane coupling agent containing an amino group, a carboxyl group, an aldehyde group or a thiol group or a metal complex containing nickel, iron, gold, silver, or platinum to decorate the surface 18, and the physical method is a non-covalent bonding method used for decorating the surface 18. The detecting sample is preferably an electrically charged matter such as nanoparticles, chemical molecules, or ribonucleic acid (RNA), deoxyribonucleic acid (DNA), vitamin H (biotin), or a biological matter such as an enzyme, a protein, a virus or a lipid, etc. Users can detect the properties of a detecting sample to select an appropriate material for decorating the surface 18.

Figure 2:
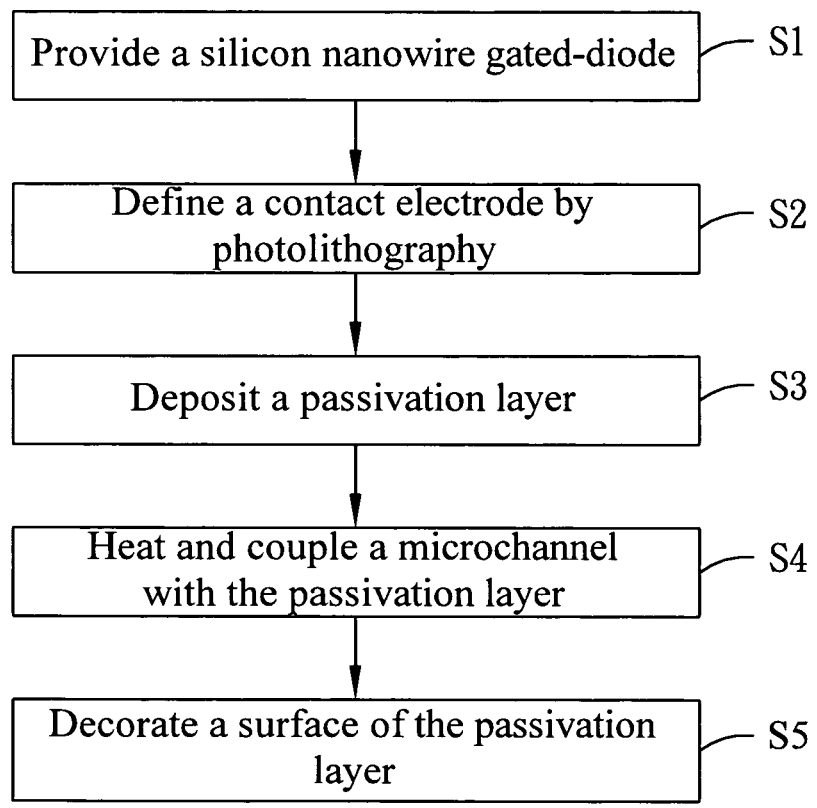
FIG. 2 is a flow chart of a manufacturing method of a sensing element integrating silicon nanowire gated-diodes in accordance with the present invention.
Figure 3:
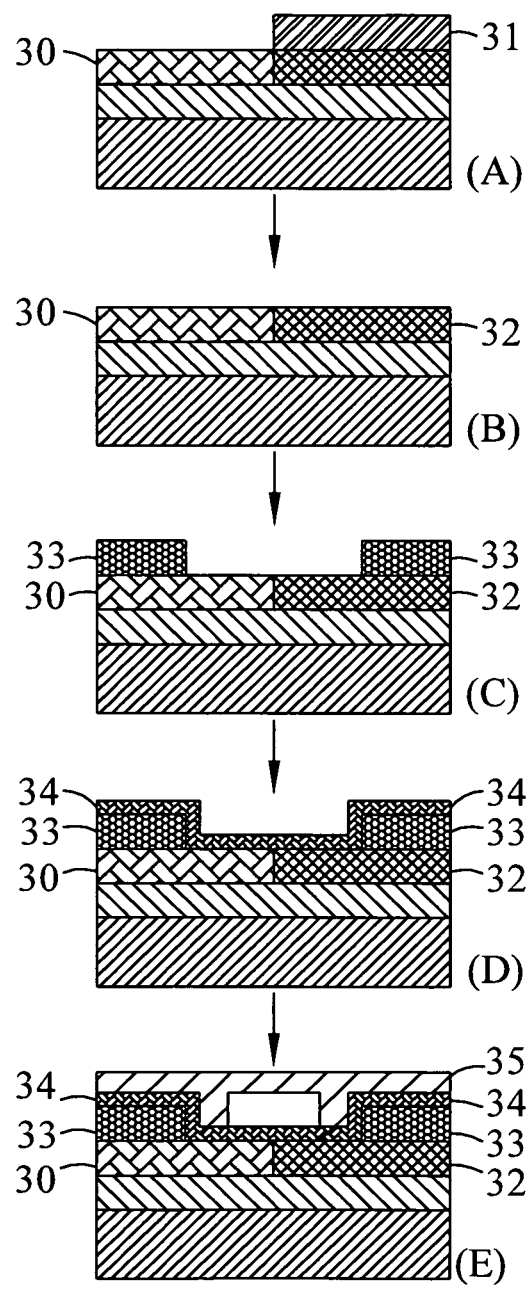
FIG. 3 is a schematic view of manufacturing a sensing element integrating silicon nanowire gated-diodes in accordance with the present invention.

With reference to FIGS. 2 and 3 for a flow chart of a manufacturing method and a manufacture of a sensing element integrating silicon nanowire gated-diodes in accordance with the present invention respectively, the manufacturing method of the sensing element integrating silicon nanowire gated-diodes comprises the following steps.

In Step S1, a silicon nanowire gated-diode is provided. A nanowire pattern is defined by a photolithography and etching a silicon substrate 30, and a nickel metal 31 is deposited at an end of the silicon nanowire as show in FIG. 3A, and then a heating and annealing process is performed at 300~600° C. to form nickel silicide 32 as shown in FIG. 3B, and a mixed solution of sulfuric acid and hydrogen peroxide is used for etching unreacted nickel metal 31 to obtain the silicon nanowire gated-diode.

In Step S2, a contact electrode 33 is defined by a photolithography as shown in FIG. 3C.

In Step S3, a passivation layer 34 is deposited to protect the silicon nanowire gated-diode as shown in FIG. 3D.

In Step S4, the microfluidic channel 35 and the passivation layer 34 are heated and coupled as shown in FIG. 3D. After ultraviolet/ozone and plasma are used for cleaning the microfluidic channel 35 and the passivation layer 34, the microfluidic channel 35 and the passivation layer 34 are coupled and heated on a heating plate at 80~100° C. for four hours.

In Step S5, a surface of the passivation layer 34, particularly the surface corresponding to the microfluidic channel 35, is decorated to complete manufacturing the sensing element, wherein the decorating method has been described above and will not repeated here.

Figure 4A:
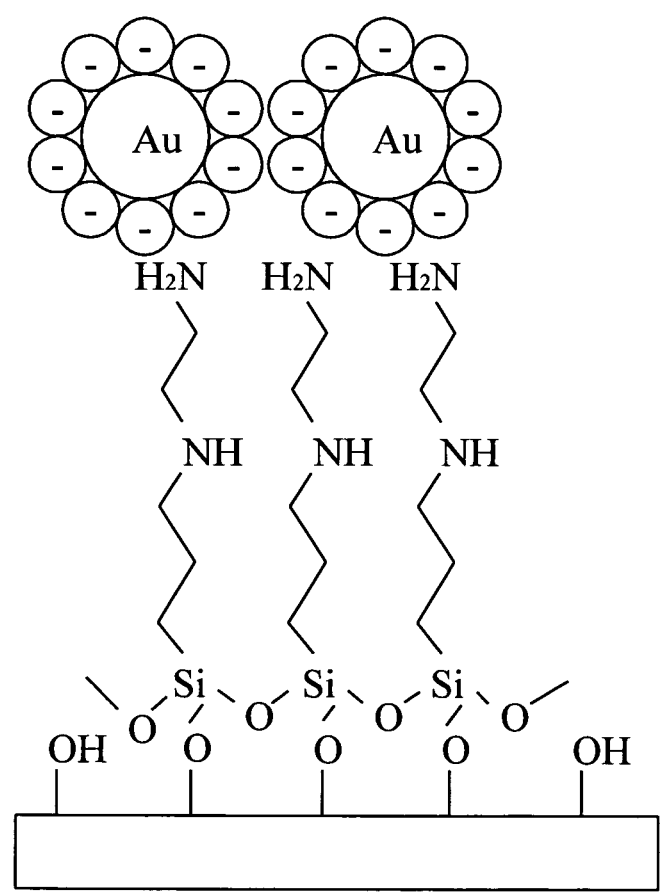
FIG. 4A is a schematic view of decorating gold nanoparticles at a sensing element in accordance with the present invention.
Figure 4B:
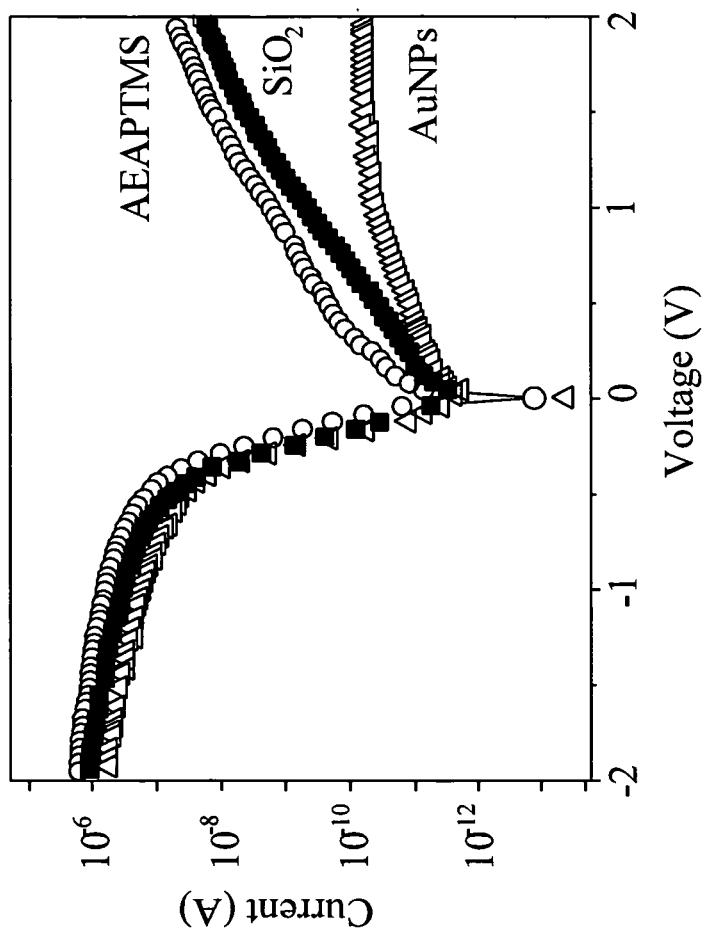
FIG. 4B is an electric curve graph of a process of decorating gold nanoparticles at a sensing element in accordance with the present invention.

With reference to FIG. 4A for a schematic view of decorating gold nanoparticles at a sensing element integrating silicon nanowire gated-diodes in accordance with the present invention, ultraviolet/ozone and plasma are used for cleaning the sample, and then sensing element integrating silicon nanowire gated-diodes are placed into an AEAPTMS solution with a molar concentration of 0.001M~0.01M for 10~30 minutes to complete decorating the amino groups, and an absolute alcohol is used to rinse the sensing element integrating silicon nanowire gated-diodes, and the sensing element integrating silicon nanowire gated-diodes decorated by the amino groups are placed into a gold nanoparticle solution for 2~24 hours to complete decorating the gold nanoparticles for capturing organisms. In FIG. 4B, a SiO2 curve shows an electric curve of undecorated sensing element integrating the silicon nanowire gated-diodes, and an AEAPTMS curve shows an electric curve of sensing element integrating the silicon nanowire gated-diodes decorated by amino groups, an AuNPs curve shows an electric curve of the sensing element integrating silicon nanowire gated-diodes decorated by gold nanoparticles, and a current-voltage curve varies according to different conditions of the surfaces of the sensing element integrating silicon nanowire gated-diodes.

Figure 5:
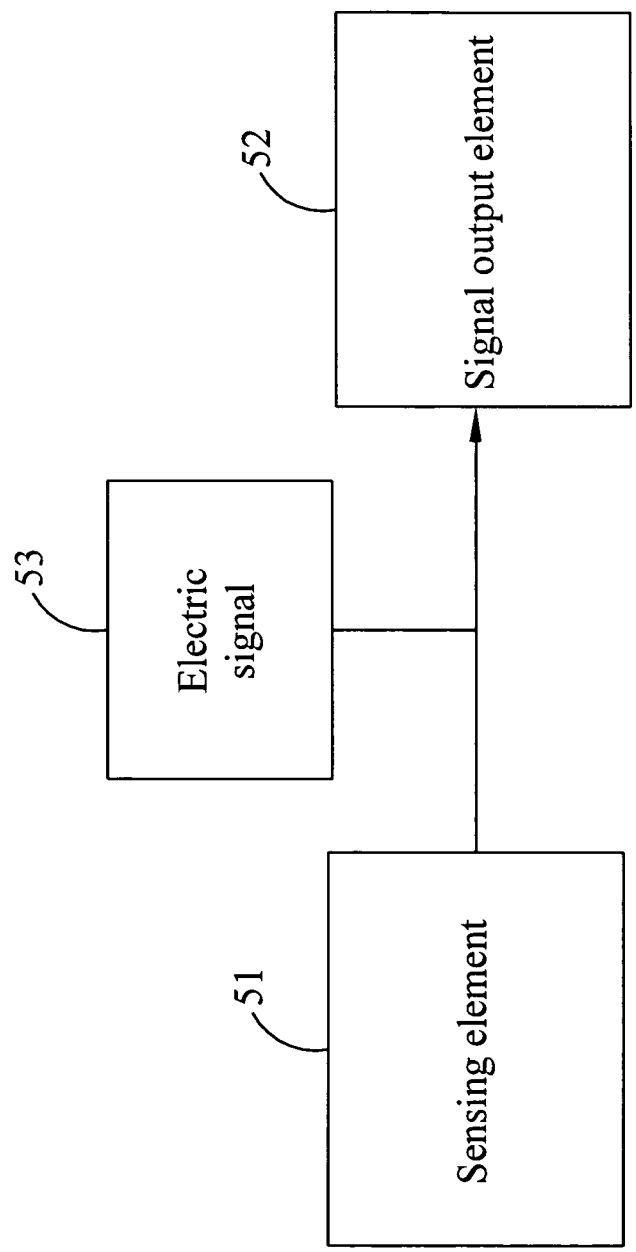
FIG. 5 is a block diagram of a detecting system of the present invention.

With reference to FIG. 5 for a block diagram of a detecting system of the present invention, the detecting system comprises a sensing element integrating silicon nanowire gated-diodes 51 and a signal output element 52. The sensing element 51 is provided for detecting an electric signal 53, and the signal output element 52 is provided for outputting and recording the electric signal 53. A change of electric signal 53 can be observed for performing a trace detection of detecting sample.

The signal output element 52 is preferably a semiconductor parameter analyzer, and the electric signal 53 preferably has a current value, a resistance value or a conductance value.

Figure 6A:
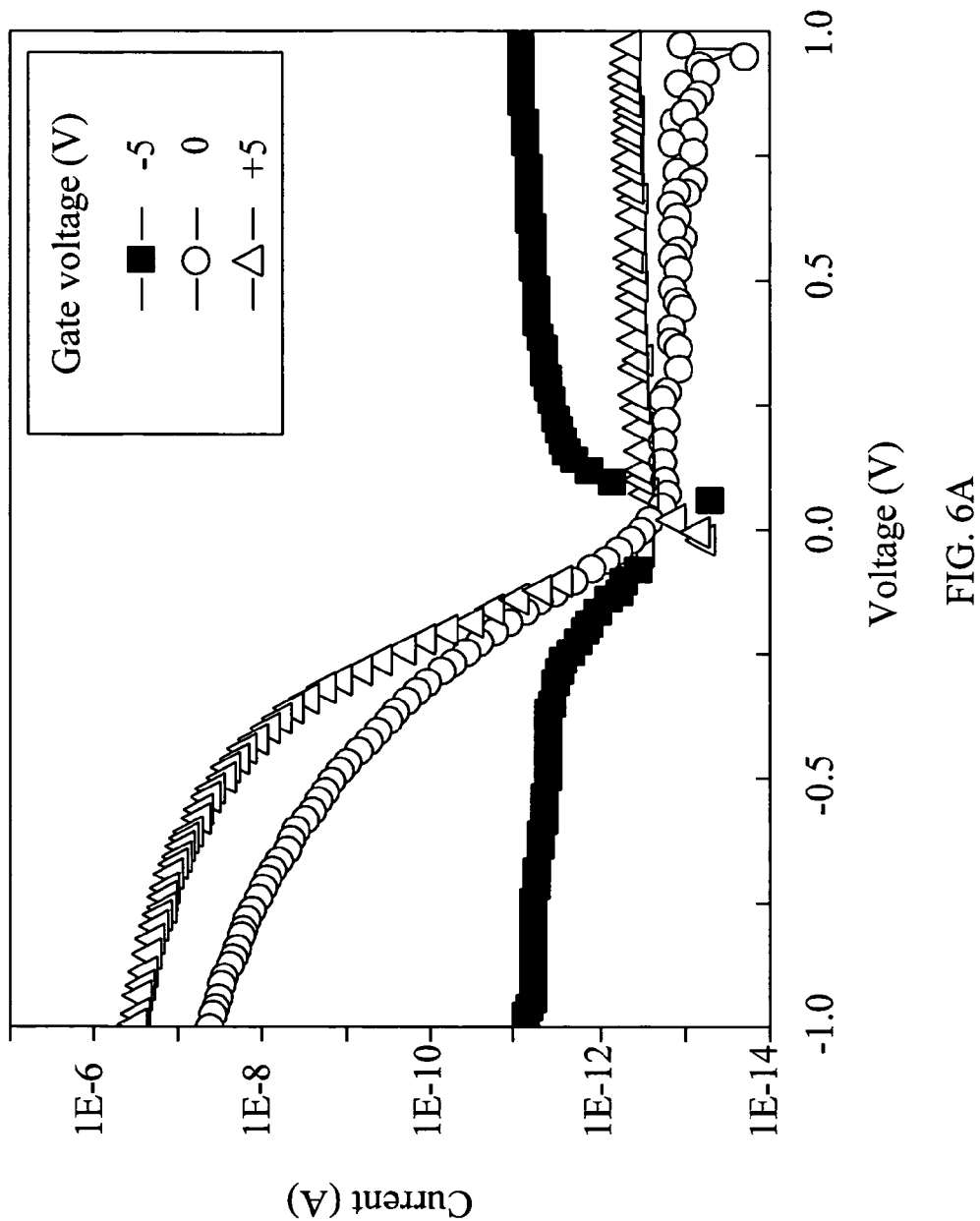
FIG. 6A is an electric curve graph of a silicon nanowire Schottky diode.
Figure 6B:
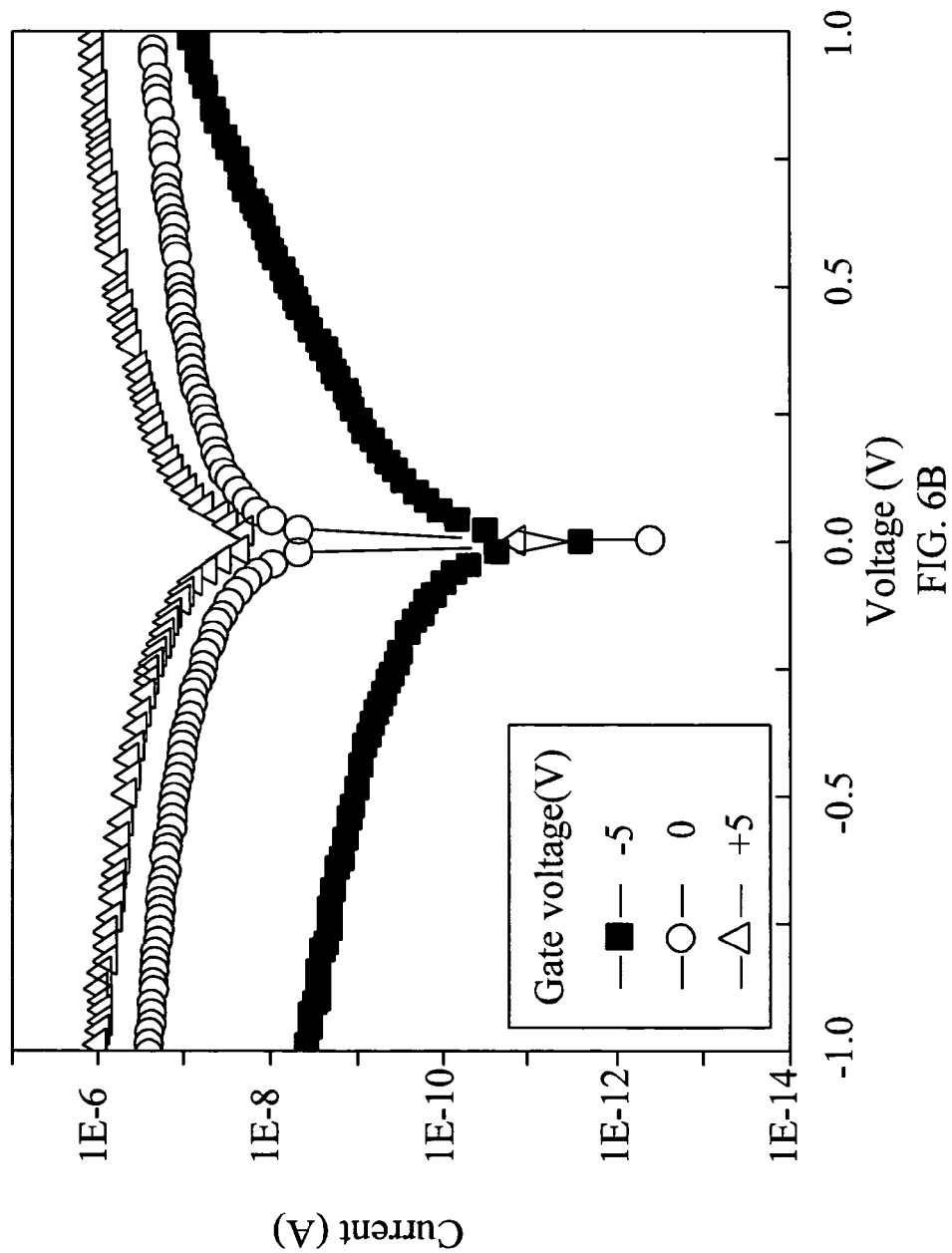
FIG. 6B is an electric curve graph of a silicon nanowire field effect transistor.

With reference to FIGS. 6A and 6B for electric curve graphs of a silicon nanowire Schottky diode and a silicon nanowire field effect transistor respectively, the silicon nanowire field effect transistor has $10^2$ times of the capacity of adjusting the voltage of a gate electrode within a range of ±5V, and the silicon nanowire Schottky diode has $10^5$ times of the capacity of adjusting the voltage of a gate electrode of a forward voltage, so that the silicon nanowire Schottky diode has a better gate controlling capability than the silicon nanowire field effect transistor, and the silicon nanowire Schottky diode is more suitable to be applied to the sensing element.

Figure 7A:
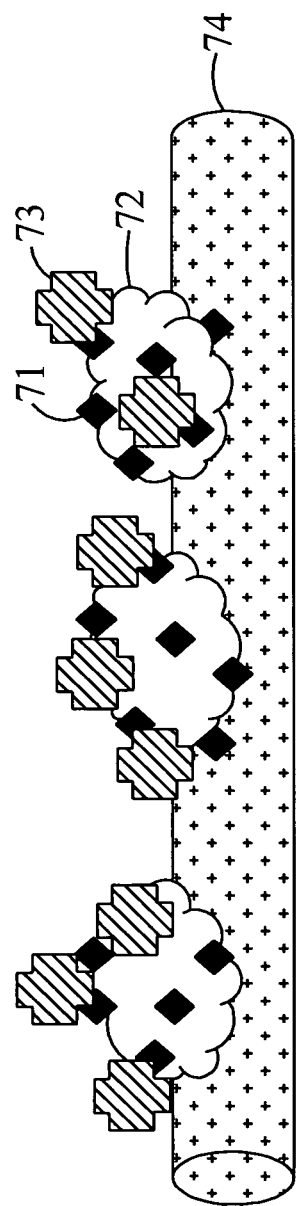
FIG. 7A is a schematic view of decorating vitamin H (biotin) at a silicon nanowire.
Figure 7B:
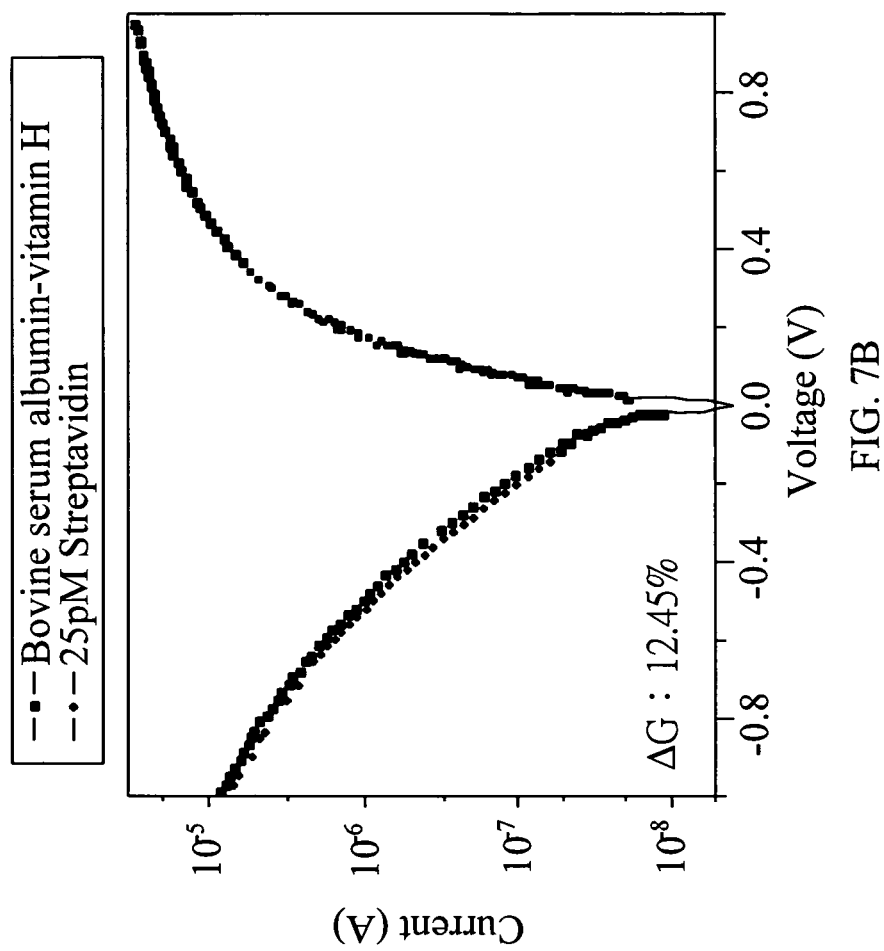
FIG. 7B is an electric curve graph of decorating vitamin H (biotin) at a silicon nanowire Schottky diode for detecting streptavidin.
Figure 7C:
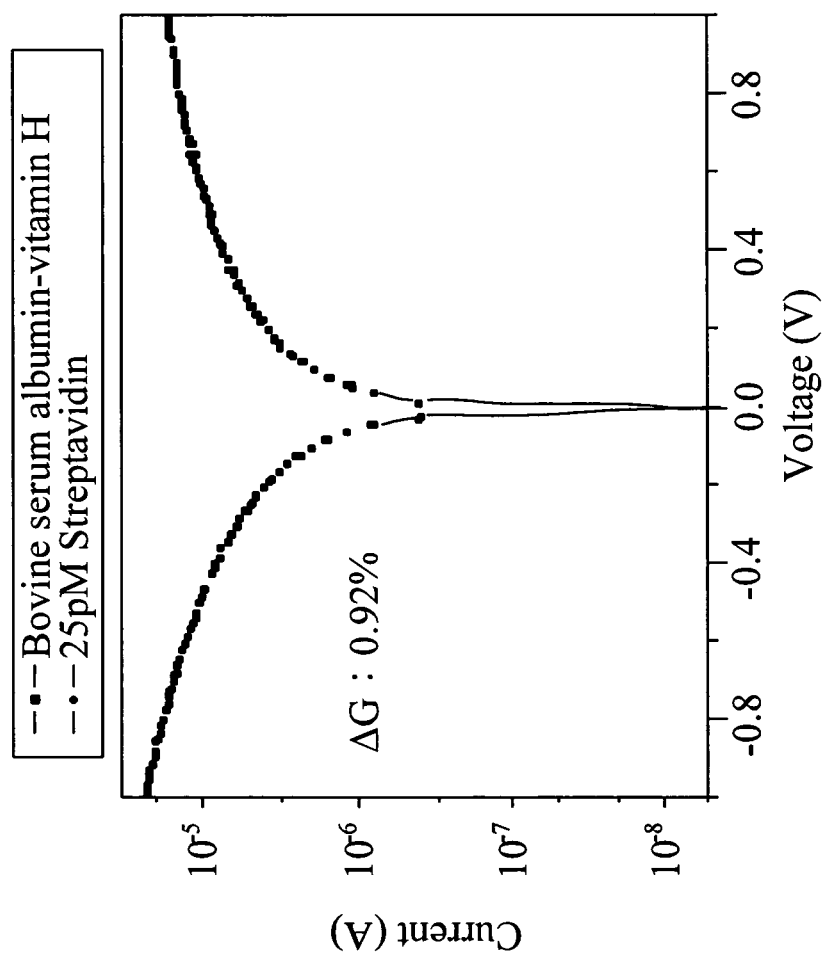
FIG. 7C is an electric curve graph of decorating vitamin H (biotin) at a silicon nanowire field effect transistor for detecting streptavidin.

With reference to FIG. 7A for a schematic view of decorating a silicon nanowire at a vitamin H (biotin), the vitamin H 71 and a bovine serum albumin (BSA) 72 are used for decorating a surface 74 of the silicon nanowire, and streptavidin 73 is combined with the vitamin H71 and coupled with the surface 74 of the silicon nanowire. Since a buffering solution of streptavidin 73 with a pH value of 6 carries negative electric charges, therefore the electric conductance will change when the streptavidin 73 and vitamin H71 are combined. With reference to FIGS. 7B and 7C respectively for electric curve graphs of decorating vitamin H at a silicon nanowire Schottky diode and a silicon nanowire field effect transistor for detecting streptavidin, the silicon nanowire Schottky diode still maintains a change of 12.45% of an electric conductance when the silicon nanowire Schottky diode is decorated by vitamin H at a streptavidin of a molar concentration of 25 pM, but the silicon nanowire field effect transistor almost has almost no change (or just 0.92%) of the electric conductance when the silicon nanowire field effect transistor is decorated by vitamin H at a streptavidin of a molar concentration of 25 pM. These experiment results show that the silicon nanowire Schottky diode can be applied in a super-low concentration biological detection area effectively.

While the invention has been described by means of specific embodiments, numerous modifications and variations could be made thereto by those skilled in the art without departing from the scope and spirit of the invention set forth in the claims.

What is claimed is:

1. A sensing element integrating silicon nanowire gated-diodes, comprising:
   a silicon nanowire gated-diode arranged for detecting a detecting sample;
   a passivation layer, covered onto the silicon nanowire gated-diode, and having a decorated surface arranged for contacting a detecting sample without any labeling; and
   a microfluidic channel, coupled with the passivation layer;
   wherein if the detecting sample is in contact with the decorated surface arranged for contacting the detecting sample without any labeling of the passivation layer covered onto the silicon nanowire gated-diode arranged for detecting a detecting sample through the microfluidic channel, the silicon nanowire gated-diode arranged for detecting a detecting sample will directly generate an electric signal according to the detecting sample, such that existence of the detecting sample is decided in accordance with a change of the electric signal.

2. The sensing element integrating silicon nanowire gated-diodes of claim 1, wherein the silicon nanowire gated-diode is a PN junction diode or a silicon nanowire Schottky diode.

3. The sensing element integrating silicon nanowire gated-diodes of claim 2, wherein the silicon nanowire Schottky diode further comprises:
   a substrate;
   an insulating layer, disposed on the substrate;
   a silicon nanowire, disposed on the insulating layer, and including a first portion and a second portion, and the first portion being made of a material selected from the collection of monocrystalline silicon, polycrystalline silicon and amorphous silicon, and the second portion being made of a metal silicide; and
   a plurality of contact electrodes, disposed on both ends of the silicon nanowire respectively.

4. The sensing element integrating silicon nanowire gated-diodes of claim 3, wherein the metal silicide is one selected from the collection of nickel silicide, platinum silicide, titanium silicide and cobalt silicide.

5. The sensing element integrating silicon nanowire gated-diodes of claim 3, wherein the plurality of contact electrodes are made of one selected from the collection of gold and titanium.

6. The sensing element integrating silicon nanowire gated-diodes of claim 1, wherein the microfluidic channel is made of one selected from the collection of silicon, silicide and an organic material.

7. The sensing element integrating silicon nanowire gated-diodes of claim 6, wherein the organic material is one selected from the collection of polydimethylsiloxane (PDMS), polymer material SU-8, polymethylmethacrylate (PMMA) and cyclic olefin copolymer (COC).

8. The sensing element integrating silicon nanowire gated-diodes of claim 1, wherein the decorated surface is decorated by a chemical method or a physical method.

9. The sensing element integrating silicon nanowire gated-diodes of claim 8, wherein the chemical method uses a silane coupling agent or a metal complex for a decoration.

10. The sensing element integrating silicon nanowire gated-diodes of claim 9, wherein the silane coupling agent is comprised of an amino group, a carboxyl group, an aldehyde group or a thiol group.

11. The sensing element integrating silicon nanowire gated-diodes of claim 9, wherein the metal complex is comprised of nickel, iron, gold, silver or platinum.

12. The sensing element integrating silicon nanowire gated-diodes of claim 8, wherein the physical method is a non-covalent bonding method.

13. The sensing element integrating silicon nanowire gated-diodes of claim 1, wherein the detecting sample is made of one selected from the collection of nanoparticles, chemical molecules, and a biological matter.

14. The sensing element integrating silicon nanowire gated-diodes of claim 13, wherein the biological matter is one selected from the collection of ribonucleic acid (RNA), deoxyribonucleic acid (DNA), enzyme, protein, virus and lipid.

15. A manufacturing method of a sensing element integrating silicon nanowire gated-diodes, comprising the steps of:
 a) providing a silicon nanowire gated-diode arranged for detecting a detecting sample;
 b) defining a plurality of contact electrodes by a photolithography;
 c) depositing a passivation layer having a decorated surface arranged for contacting a detecting sample without any labeling on the silicon nanowire gated-diode arranged for detecting a detecting sample;
 d) heating to couple a microfluidic channel with the passivation layer; and
 e) decorating a surface of the passivation layer to complete manufacturing the sensing element;
 wherein if the detecting sample is in contact with the decorated surface arranged for contacting the detecting sample without any labeling of the passivation layer covered onto the silicon nanowire gated-diode arranged for detecting a detecting sample through the microfluidic channel, the silicon nanowire gated-diode will directly generate an electric signal accordingly according to the detecting sample, such that existence of the detecting sample is decided in accordance with a change of the electric signal.

16. The manufacturing method of claim 15, wherein the plurality of contact electrodes are made of gold or titanium.

17. The manufacturing method of claim 15, wherein the microfluidic channel is made of silicon, silicide or an organic material.

18. The manufacturing method of claim 17, wherein the organic material is one selected from the collection of polydimethylsiloxane (PDMS), polymer material SU-8, polymethylmethacrylate (PMMA) and cyclic olefin copolymer (COC).

19. The manufacturing method of claim 15, wherein the decorated surface is decorated by a chemical method or a physical method.

20. The manufacturing method of claim 19, wherein the chemical method uses a silane coupling agent or a metal complex for a decoration.

21. The manufacturing method of claim 20, wherein the silane coupling agent is comprised of an amino group, a carboxyl group, an aldehyde group or a thiol group.

22. The manufacturing method of claim 20, wherein the metal complex is comprised of nickel, iron, silver or platinum.

23. The manufacturing method of claim 19, wherein the physical method is a non-covalent bonding method.

24. A detecting system for detecting a detecting sample, and the detecting system comprising:
 a sensing element as recited in claim 1, for detecting an electric signal; and
 a signal output element, for outputting and recording the electric signal;
 wherein a change of the electric signal is observed to perform a trace detection of the detecting sample.

25. The detecting system of claim 24, wherein the electric signal has a current value, a resistance value or a conductance value.

26. The detecting system of claim 24, wherein the signal output element is a semiconductor parameter analyzer.

* * * * *